US010937922B2

(12) United States Patent
Ebbecke et al.

(10) Patent No.: US 10,937,922 B2
(45) Date of Patent: Mar. 2, 2021

(54) METHOD FOR THE SELF-ADJUSTED EXPOSURE OF SIDE SURFACES OF A SEMICONDUCTOR BODY

(71) Applicant: OSRAM Opto Semiconductors GmbH, Regensburg (DE)

(72) Inventors: Jens Ebbecke, Rohr in Niederbayern (DE); Sebastian Taeger, Bad Abbach (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/485,400

(22) PCT Filed: Feb. 27, 2018

(86) PCT No.: PCT/EP2018/054834
§ 371 (c)(1),
(2) Date: Aug. 12, 2019

(87) PCT Pub. No.: WO2018/158263
PCT Pub. Date: Sep. 7, 2018

(65) Prior Publication Data
US 2019/0386172 A1 Dec. 19, 2019

(30) Foreign Application Priority Data

Mar. 1, 2017 (DE) .......................... 102017104282.2

(51) Int. Cl.
*H01L 33/00* (2010.01)
*H01L 33/20* (2010.01)
(Continued)

(52) U.S. Cl.
CPC ...... *H01L 33/0095* (2013.01); *H01L 33/0093* (2020.05); *H01L 33/20* (2013.01);
(Continued)

(58) Field of Classification Search
CPC .... H01L 33/0093; H01L 33/20; H01L 33/382
See application file for complete search history.

(56) References Cited

U.S. PATENT DOCUMENTS 4,592,801 A * 6/1986 Hara ................. H01L 21/31116
204/192.34
5,955,748 A * 9/1999 Nakamura ................. B41J 2/45
257/88
(Continued)

FOREIGN PATENT DOCUMENTS

DE 102014117510 A1 6/2016
WO 2015055647 A 4/2015

*Primary Examiner* — Eliseo Ramos Feliciano
*Assistant Examiner* — Mikka Liu
(74) *Attorney, Agent, or Firm* — Slater Matsil, LLP

(57) ABSTRACT

A method for exposing side surfaces of a semiconductor body is disclosed. In an embodiment a method includes providing the semiconductor body having a laterally extending first main surface, forming a plurality of vertical side surfaces by partially removing material of the semiconductor body and thereby removing the first main surface in places, wherein each of the side surfaces forms an angle (α) between 110° and 160° inclusive with the remaining first main surface, applying a protective layer onto the semiconductor body so that, in a plan view, the protective layer completely covers the remaining first main surface and the obliquely formed side surfaces and partially removing the protective layer so that the protective layer is removed in regions on the obliquely formed side surfaces because of an inclination and remains at least partially preserved in regions on the remaining first main surface during a common process operation.

20 Claims, 9 Drawing Sheets

(51) Int. Cl.
*H01L 33/38* (2010.01)
*H01L 33/44* (2010.01)

(52) U.S. Cl.
CPC .......... *H01L 33/382* (2013.01); *H01L 33/44* (2013.01); *H01L 2933/0016* (2013.01); *H01L 2933/0025* (2013.01)

(56) References Cited

U.S. PATENT DOCUMENTS

| | | |
|---|---|---|
| 10,115,869 B2 | 10/2018 | Kaempf et al. |
| 2005/0020011 A1 | 1/2005 | Nakajima et al. |
| 2008/0251891 A1 | 10/2008 | Chou et al. |
| 2009/0078676 A1* | 3/2009 | Yamada .................. C23F 4/00 216/47 |
| 2017/0330997 A1 | 11/2017 | Lell et al. |

* cited by examiner

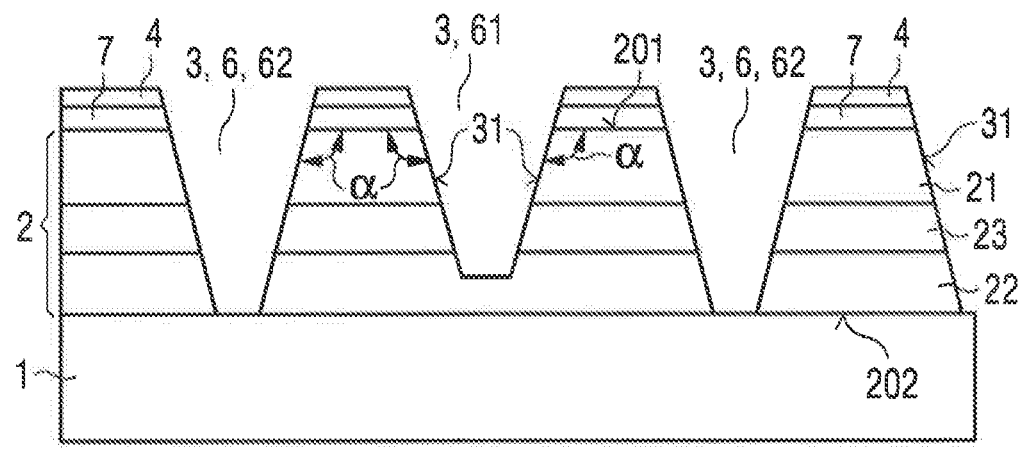
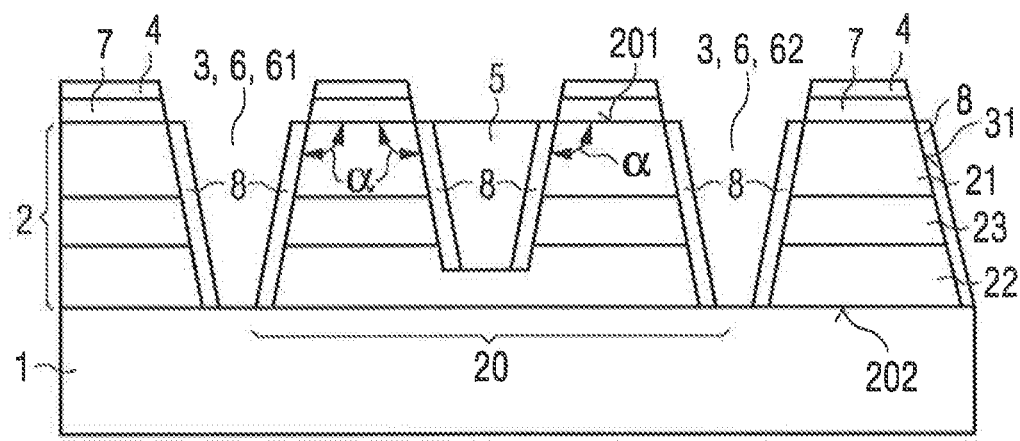

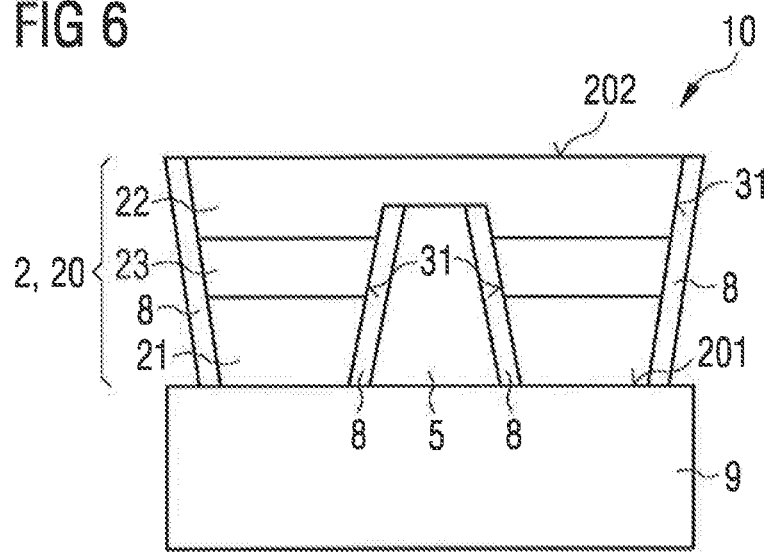
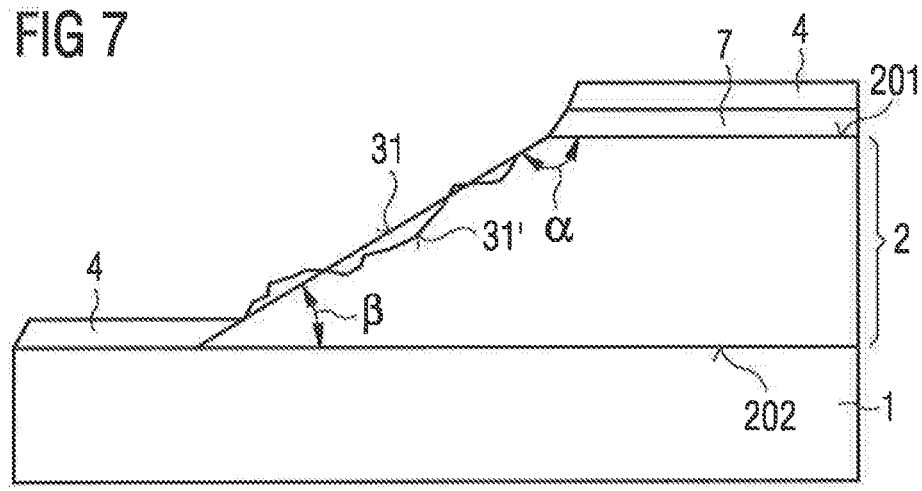

METHOD FOR THE SELF-ADJUSTED EXPOSURE OF SIDE SURFACES OF A SEMICONDUCTOR BODY

This patent application is a national phase filing under section 371 of PCT/EP2018/054834, filed Feb. 27, 2018, which claims the priority of German patent application 102017104282.2, filed Mar. 1, 2017, each of which is incorporated herein by reference in its entirety.

TECHNICAL FIELD

A method for the self-adjusted exposure of side surfaces of a semiconductor body is specified.

BACKGROUND

In the production of the semiconductor components, it is often expedient to expose only side surfaces of a semiconductor body, so that in subsequent production steps, the semiconductor body can be further processed, for example, exclusively on the side surfaces, while the rest of the semiconductor body remains covered by a protective layer and is thus protected from external influences.

SUMMARY OF THE INVENTION

Embodiments provide an efficient method, in which the side surfaces of a semiconductor body can be processed separately at least temporarily.

In at least one embodiment of a method for exposing side surfaces of a semiconductor body, the semiconductor body is provided. The semiconductor body has a laterally extending first main surface, which is for instance flat. A plurality of vertical side surfaces are formed by partially removing material from the semiconductor body. In particular, the first main surface is removed in places. The side surfaces are formed so that they form an angle between 110° and 160° inclusive with the remaining first main surface. The side surfaces form an angle between 20° and 70° with a vertical perpendicular on the first main surface which is particularly flat. The side surfaces are therefore not perpendicular or essentially perpendicular but are oblique to the first main surface of the semiconductor body.

According to at least one embodiment of the method, a protective layer is applied onto the semiconductor body so that in a plan view, the protective layer covers the remaining first main surface and the oblique side surfaces in particular completely. In a subsequent process step, the protective layer is partially removed, wherein the protective layer can be removed for instance solely due to its local different orientations on the semiconductor body in such a way that in particular during a common process step, because of the inclination, the protective layer is completely or substantially completely removed in regions on the obliquely formed side surfaces and is at least partially preserved in regions on the remaining first main surface. In other words, the side surfaces of the semiconductor body are exposed from the protective layer in a self-adjusted manner, while other regions of the semiconductor body remain covered by the protective layer. The exposed side surfaces can then be processed separately, e.g., further structured or passivated. Via the exposed side surfaces, additives, particles or ions can be diffused into the semiconductor body.

The side surfaces can be inner or outer side surfaces of the semiconductor body. An inner side surface is understood to mean an interior surface of the semiconductor body which is at least partially or completely enclosed by the semiconductor body in lateral directions. The inner side surface can be an inner wall of an opening, for example, in the form of a through-recess, i.e., of an opening extending throughout the semiconductor body, or in the form of a recess, i.e., of a blind hole in the semiconductor body. For example, the opening is provided for forming through-via in the semiconductor body or for forming a separating trench or a mesa trench, wherein the separating trench or the mesa trench may extend along the entire lateral extent of the semiconductor body for instance to divide the semiconductor body into a plurality of main bodies. A plurality of such openings can be formed. The outer side surface is understood to mean an exterior surface of the semiconductor body which is located for instance at one edge of the semiconductor body and delimits the semiconductor body at least in a lateral direction.

A lateral direction is understood to mean a direction that runs along, in particular parallel to the first main surface of the semiconductor body. A vertical direction is understood to mean a direction which is transverse, in particular perpendicular or substantially perpendicular to the first main surface of the semiconductor body and thus directed perpendicular to the lateral directions. The semiconductor body may have a semiconductor layer sequence which is epitaxially grown on a growth substrate. For example, the vertical direction is determined by a growth direction of the semiconductor body.

According to at least one embodiment of the method, the first main surface is flat. A flat main surface is understood to mean a surface that is smooth and has barely or no differences in vertical height which change abruptly. However, such a flat main surface may have small local vertical roughness in the form of elevations or depressions within the manufacturing tolerances. The side surfaces of the semiconductor body are preferably flat, at least in places, i.e., locally flat. Globally as a whole, the side surfaces may be curved. In case of doubt, the angle between the side surface and the first main surface is determined by a local angle between the corresponding side surface, at least locally approximated as being flat, and the first main surface, at least locally approximated as being flat.

In accordance with at least one embodiment of the method, the protective layer is removed locally in a self-adjusted manner in a common etching step, wherein the protective layer is removed solely due to a higher etching rate on the oblique side surfaces and the protective layer is simultaneously preserved, for example, thinned, on the remaining first main surface due to a lower etching rate. Because of the inclination, the oblique side surfaces are easily accessible and can be exposed in a targeted manner.

The common etching step is preferably carried out by dry etching, for example, by physical, chemical or physical-chemical dry etching. Dry etching includes gas phase-, plasma-, laser-, electron-beam- and ion-etching, wherein ion-etching further includes reactive ion etching, sputtering and reactive as well as chemically assisted ion beam etching. In general, during the process of dry etching and ion etching such as sputtering, the material of the protective layer is removed locally by adjusting the etching rate or the local sputter yield. The sputtering described here, wherein the material of a layer is removed by bombardment with ions, is to be distinguished from a sputter coating, wherein ejected atoms deposit on a surface and form a new layer.

It has been found that the local etching rate or the local sputter yield can be adjusted solely due to different orientations of the protective layer on the obliquely formed side surfaces and on the first, in particular flat, main surface of the semiconductor body in such a way that the protective layer is removed exclusively on the obliquely formed side surfaces to expose the semiconductor body in places, but at the same time remains on the first main surface.

According to at least one embodiment of the method, the protective layer is formed from an electrically insulating material, for instance from $Al_2O_3$, $SiO_2$, SiN, $Ta_2O_5$, AlN, $TiO_2$, $ZrO_2$, $HfO_2$ or from another material having similar material properties. The protective layer can be applied to the semiconductor body by a coating process such as sputtering (PVD: physical vapor deposition), atomic layer deposition (ALD) or chemical vapor deposition (CVD), in particular plasma enhanced chemical vapor deposition (PECVD).

The protective layer is preferably formed from $Al_2O_3$, wherein the side surfaces are subsequently exposed by an argon-supported dry etching process. It was found that this dry etching process has a significantly higher etch rate for $Al_2O_3$ on the oblique side surfaces than for $Al_2O_3$ on horizontal surfaces of the protective layer. During a common process step, this results in the side surfaces being exposed from the protective layer, while the horizontal surfaces, for example, the lateral surfaces of the semiconductor body, remain covered by the protective layer.

According to at least one embodiment of the method, the side surfaces, which are covered in particular completely by the protective layer, are exposed during the step of partial removal of the protective layer. After partially removing the protective layer, an electrically insulating material can be applied onto the exposed side surfaces so that they are covered by a passivation layer made of the electrically insulating material. The exposed side surfaces are thus directly adjacent to the passivation layer in particular. The passivation layer on the exposed side surfaces can be formed by a coating process, e.g., by atomic layer deposition or vapor deposition. In particular, the passivation layer and the protective layer have different materials. The passivation layer is preferably made of a material that is more resistant to etching than a material of the protective layer. Expediently, the protective layer can be removed completely from the semiconductor body in a subsequent process step, e.g., after the passivation layer has been applied.

According to at least one embodiment of the method, a mask is used in forming the plurality of vertical side surfaces of the semiconductor body. The mask can have a plurality of windows, wherein the oblique side surfaces are formed at least partially in regions of the windows and/or at the side of the mask. Before applying the mask to the semiconductor body, the first main surface may be exposed. After the protective layer has been applied over a large area, the first main surface and/or the mask can be covered by the protective layer, for instance completely.

According to at least one embodiment of the method, openings are formed in the semiconductor body. The semiconductor body has a second main surface facing away from the first main surface. In particular, the first and second main surfaces delimit the semiconductor body in the vertical direction. From the first main surface towards the second main surface, as the distance increases, each of the openings may have a smaller cross-section. This means that the openings are tapered from the first main surface towards the second main surface. The openings may have a tapered shape, such as the form of a cone, pyramid or prism having a triangle as base. It is also possible for the openings to be in the form of a truncated cone, a truncated pyramid or a prism with a square, in particular with a trapezoidal base. The oblique side surfaces can be inner walls of the openings.

Along the vertical direction, the openings can extend through the semiconductor body, for example, from the first main surface as far as the second main surface of the semiconductor body. In this case, the openings are formed as through-recesses, wherein the bottom surfaces of the openings can be surfaces of a substrate on which the semiconductor body is deposited. The substrate may be a growth substrate or different from a growth substrate. It is possible that some or all of the openings are formed as recesses, i.e., as blind holes in the semiconductor body. In this case, the openings extend for instance from the first main surface to a point, a line or a surface between the first and second main surfaces of the semiconductor body.

According to at least one embodiment of the method, the side surfaces are formed by inner walls of openings, wherein the openings are laterally spaced from one another and each of which is enclosed, in particular completely enclosed by the semiconductor body in lateral directions. Alternatively or in addition, it is possible for the semiconductor body to have obliquely formed side surfaces which are formed by side flanks of openings, wherein the openings are formed as trenches, in particular as separating trenches, and extend along the entire lateral extent of the semiconductor body. Such trenches can divide the semiconductor body into a plurality of laterally spaced subregions, each of which can form a main body of a component, for example, of an optoelectronic component.

In accordance with at least one embodiment of the method, the side surfaces extend along the vertical direction from the first main surface to a bottom surface which is in particular flat and parallel to the first main surface. The flat bottom surface can be a surface of a substrate that is exposed during the formation of the corresponding opening, for example. In this case, the bottom surface is approximately at the same vertical height as the second main surface of the semiconductor body. Alternatively, it is possible for the flat bottom surface to be arranged in the vertical direction between the first main surface and the second main surface.

According to at least one embodiment of the method, the oblique side surfaces do not extend over the entire vertical extent of the semiconductor body. Such side surfaces can be formed by inner walls of openings, for example, in the form of recesses in the semiconductor body. In this case, the recesses may each have a bottom surface formed by an exposed surface of a semiconductor layer of the semiconductor body.

For example, the semiconductor body comprises a semiconductor layer, a further semiconductor layer and an active layer located there between. The recess can extend through one of the semiconductor layers and the active layer to the other semiconductor layer. After passivation of the side surfaces, the recesses can be filled with an electrically conductive material, for example, with a metal such as copper, nickel, silver or gold for electrical contacting of the further semiconductor layer. Alternatively or in addition, it is possible that the side surfaces of some or all the recesses are exposed by partially removing the protective layer. In a subsequent process step, at least some or all of the recesses can be formed as through-recesses throughout the semiconductor body. A wet-chemical etching process is also suitable for this, since the remaining regions of the semiconductor body continue to be covered by the protective layer and thus remain protected from an etchant.

BRIEF DESCRIPTION OF THE DRAWINGS

Further advantages, preferred embodiments and further developments of the method or of the component will become apparent from the exemplary embodiments explained below in conjunction with FIGS. 1A to 7.

FIGS. 2A, 2B, 3A, 3B, 3C, 3D, 4A and 4B show schematic sectional views of some method steps of further exemplary embodiments, in particular for processing a semiconductor body;

FIG. 6 shows a schematic representation of a component; and

FIG. 7 shows a section of the semiconductor body having an oblique side surface.

Figure 1A:
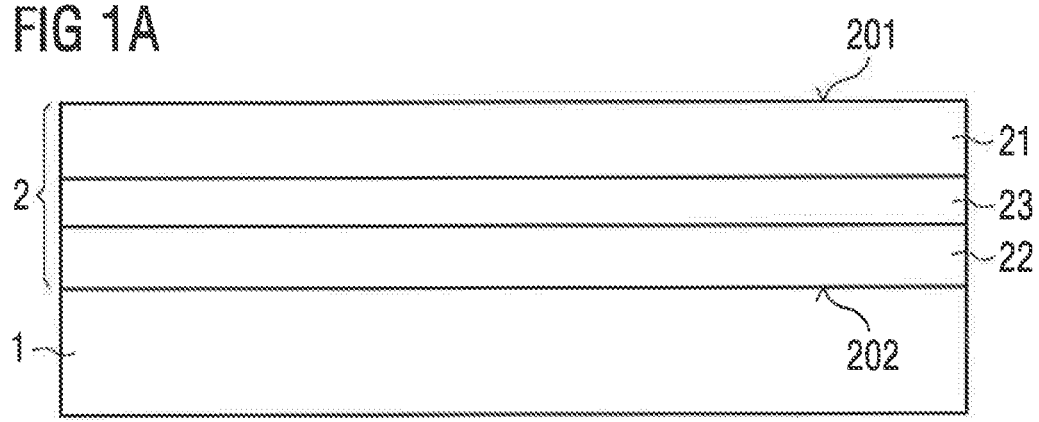
FIGS. 1A, 1B, 1C, 1D, 1E and 1F show schematic cross-sectional views of various method steps of an exemplary embodiment, in particular for processing a semiconductor body.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

FIG. 1A shows a semiconductor composite, such as a wafer composite. The semiconductor composite comprises a semiconductor body 2 arranged on a substrate 1. The substrate 1 can be a growth substrate, such as a sapphire substrate. In particular, the semiconductor body 2 is deposited layer by layer on the substrate 1 by an epitaxial process. It is possible that the substrate 1 is different from a growth substrate. For example, before or after mesa etching, the semiconductor body 2 is separated from a growth substrate by a laser lift-off process (LLO) or by an etching process and gets bonded to the substrate 1. The semiconductor body 2 can be part of a single semiconductor chip.

The semiconductor body 2 may be formed from a III-V or II-VI compound semiconductor material. A III-V compound semiconductor material has one element from the third main group and one element from the fifth main group. A II-VI compound semiconductor material has one element from the second main group and one element from the sixth main group. For example, the semiconductor body 2 is based on GaN, InGaN or InAlP.

The semiconductor body 2 has a first main surface 201 facing away from the substrate 1 and a second main surface 202 facing towards the substrate 1. In particular, the first main surface 201 is formed by a surface of a first semiconductor layer 21 and the second main surface 202 is formed by a surface of a second semiconductor layer 22 of the semiconductor body 2. The first main surface 201 and/or the second main surface 202 can be flat or smooth within the manufacturing tolerances. For example, the first semiconductor layer 21 is p-conductive and the second semiconductor layer 22 is n-conductive, or vice versa. The semiconductor body 2 has an active layer 23 disposed between the first semiconductor layer 21 and the second semiconductor layer 22. In particular, the active layer 23 is configured for the emission or for the detection of electromagnetic radiation in the visible, ultraviolet or infrared spectral range.

Figure 1B:
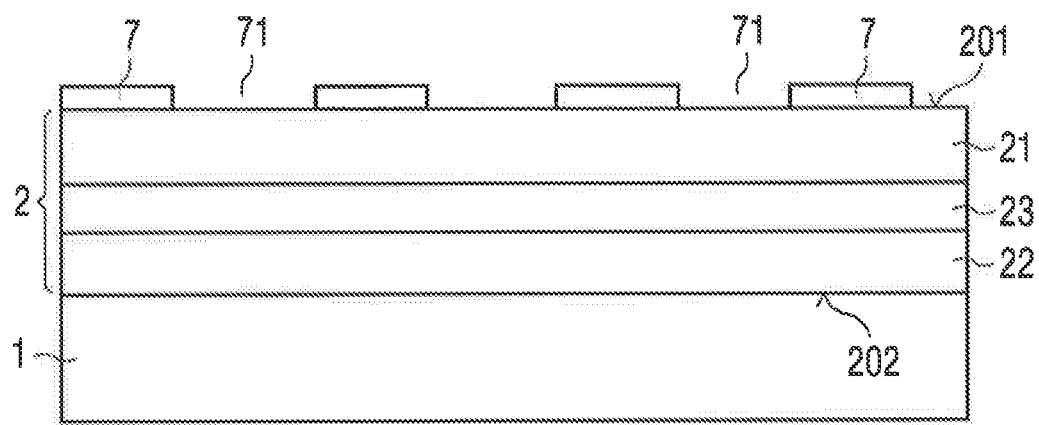

In FIG. 1B, a mask 7 is applied to the semiconductor body 2, in particular directly onto the first main surface 201. The mask 7 has a plurality of windows 71. In the regions of windows 71, the first main surface 201 is exposed and thus accessible. The mask 7 can be a resist mask being formed from a positive or negative resist, wherein for forming the mask 7 having the windows 71, the resist is exposed to light in places and is not exposed to light in places. The mask 7 can be a cured $SiO_2$-mask. It is also possible that the mask 7 having the windows 71 is prefabricated and already has a plurality of windows 71 when it is applied to the semiconductor body 2. The mask 7 has a vertical layer thickness which can be between 10 nm and 10 µm inclusive, for instance between 1 µm and 10 µm, 1 µm and 4 µm, or between 30 nm and 1 µm, 30 nm and 150 nm inclusive, for example, between 60 nm and 90 nm.

Figure 1C:
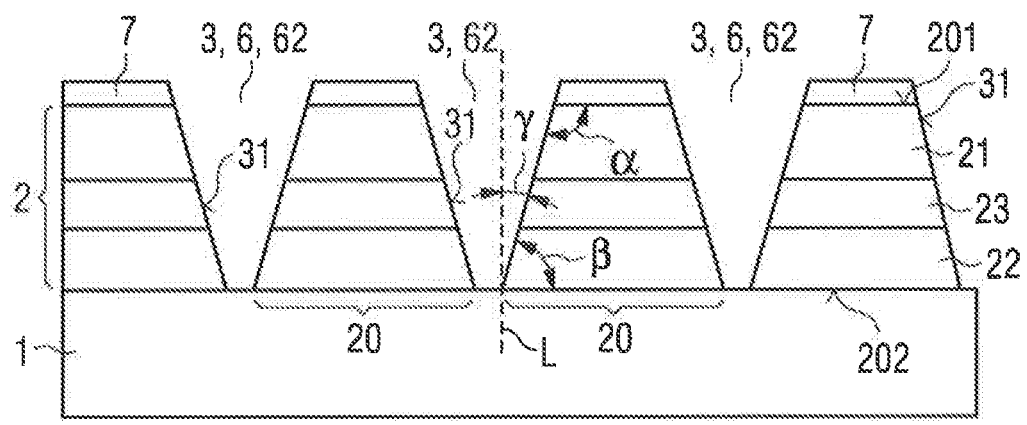

According to FIG. 1C, a plurality of vertical side surfaces 31 of the semiconductor body 2 are formed, in particular with the help of the mask 7. The side surfaces 31 are formed obliquely to the first main surface 201 and/or to the second main surface 202. The obliquely formed side surfaces 31 are located in FIG. 1C in the regions of the windows 71 or sidewards of the mask 7, wherein the side surfaces 31 located in the regions of the windows 71 are referred to as inner side surfaces and the side surfaces 31 located sidewards of the mask 7 are referred to as outer side surfaces 31 of the semiconductor body 2.

For forming the oblique side surfaces 31, in particular the inner side surfaces 31, one or a plurality of openings 3 are formed in the semiconductor body 2. In FIG. 1C, the openings 3 extend from the first main surface 201 along the vertical direction as far as the second main surface 202, i.e., throughout the semiconductor body 2. Such openings 3 are called through-recesses 62 of the semiconductor body 2. By forming the through-recesses 62, the substrate 1 can be exposed in places in the openings 3. The substrate 1 has a surface which faces the semiconductor body 2, is for instance flat and in particular defines the second main surface 202 of the semiconductor body 2.

Deviating from FIG. 1C, it is possible that the openings 3 are formed in such a way that they penetrate from the first main surface 201 only up to the first semiconductor layer 21, up to the active layer 23 or up to the second semiconductor layer 22. In this case, the openings 3 each form a recess, i.e., a blind hole, in the semiconductor body 2. It is also possible that some of the openings 3 are formed as recesses and some of the other openings 3 are formed as through-recesses.

During the formation of the openings 3, material of the semiconductor body 2 is removed, wherein parts of the first main surface 201 are removed. For this purpose, a wet chemical etching process or a dry etching process can be applied, such as deep reactive ion etching (DRIE) or reactive ion etching (RIE), in particular using chlorine or fluorine as etching agent. Alternatively, a mechanical process may be used to form the openings 3. The openings 3 can be laterally spaced from each other. In this case, the inner walls of laterally spaced openings 3 form the inner side surfaces 31, with the openings 3 being completely enclosed in lateral directions by the semiconductor body 2. The openings 3 may be formed as separating trenches 6 extending along the entire lateral extent of the semiconductor body 2. Due to the separating trenches 6, the semiconductor body 2 can be divided into a plurality of laterally spaced main bodies 20, wherein the side surfaces 31 are side flanks of the main bodies 20.

Preferably, the side surfaces 31 are formed in such a way that they form an angle α between 110° and 160° with the remaining first main surface 201. The angle α is thus an inner angle in the semiconductor body 2 between the side surface 31 and the first main surface 201. In FIG. 1C, the side surfaces 31 form an inner angle β with the second main surface 202. If the first main surface 201 and the second main surface 202 run parallel to each other, the sum of α and β is 180°. Preferably, the inner angle β is therefore between 70° and 20°. The openings 3 each have a cross-section that decreases with increasing distance from the first main surface 201 towards the second main surface 202. In FIG. 1C, the openings 3 may each have the form of a truncated cone, a truncated pyramid or an elongated prism having an isosceles trapezoid as the base.

The relative orientation of the side surface 31 to the first main surface 201 or to the second main surface 202 can be indicated by a further angle γ between the side surface 31 and a perpendicular L perpendicular to the first or second main surface of the semiconductor body 2. The sum of β and γ or the difference between α and γ is therefore 90°. Preferably, the further angle γ is therefore between 20° and 70°. In this sense, the side surfaces 31 are formed to be oblique. In particular, the angle α may be between 110° and 150° inclusive, between 110° and 140° inclusive, between 120° and 160° inclusive, or between 130° and 160° inclusive. Accordingly, the angle β or the angle γ may be between 30° and 70° inclusive, between 40° and 70° inclusive, between 20° and 60° inclusive, or between 20° and 50° inclusive.

Figure 1D:
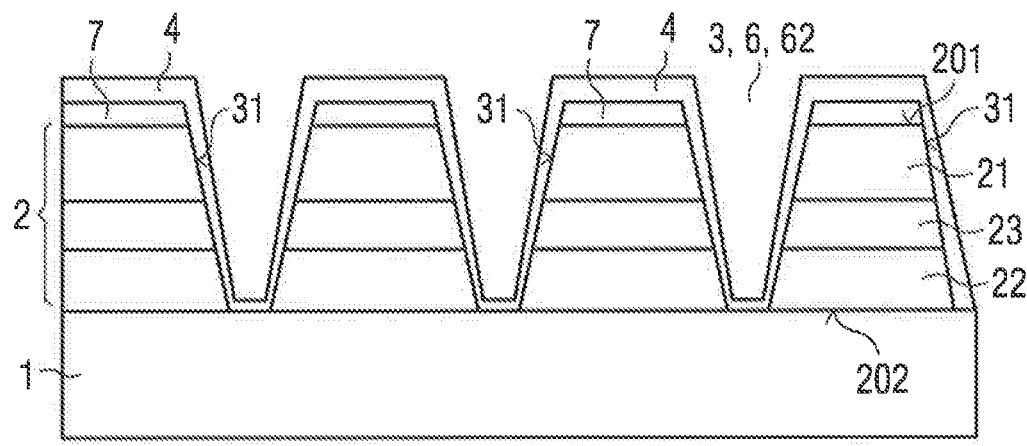

In FIG. 1D, a protective layer 4 is applied to the semiconductor body 2 in such a way that the protective layer 4 is formed over a large extent and covers the side surfaces 31, in particular all side surfaces 31. A coating process such as vapor deposition, sputtering, atomic layer deposition or gas phase deposition is suitable for this purpose. In a plan view, the protective layer 4 can completely cover the semiconductor body 2, the mask 7 and the surfaces of the substrate 1 exposed in the openings 3. The protective layer 4 may have a vertical layer thickness between 30 nm and 300 nm inclusive, between 30 nm and 150 nm inclusive, for instance between 60 nm and 90 nm. The protective layer 4 contains, for example, $Al_2O_3$.

Figure 1E:
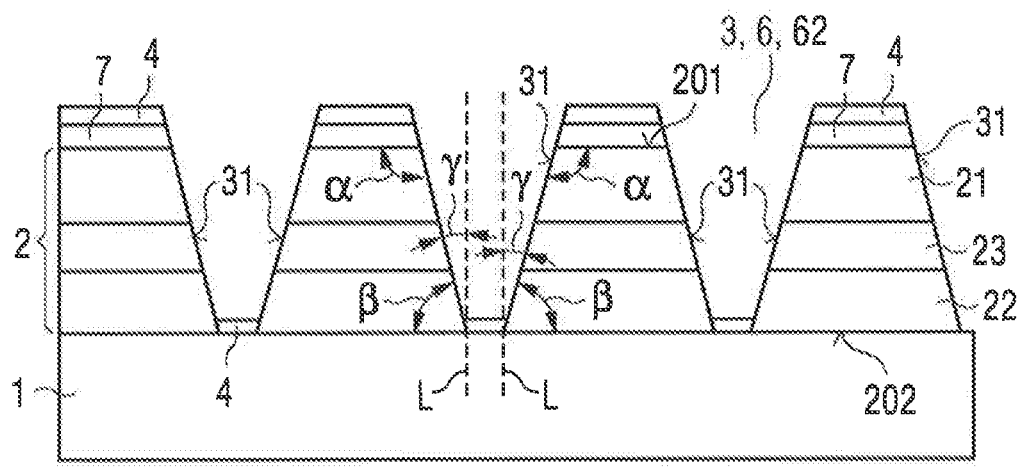

According to FIG. 1E, the protective layer 4 is preferably removed by dry etching in such a way that during a common, single process step and in particular solely because of the inclination, the protective layer 4 is completely or substantially completely removed in regions on the obliquely formed side surfaces 31 and is at least partially preserved in regions on the remaining first main surface 201. For example, the protective layer 4 is only thinned on the first main surface 201 and/or on the surfaces of the substrate 1 exposed in the openings 3. The side surface 31 is completely or substantially completely removed from the protective layer if, for example, at least 90%, at least 95% or at least 99% of the total area of the side surface 31 is free of the protective layer 4. It cannot be ruled out that remnants of the protective layer 4 may remain on the surfaces of the substrate 1 exposed in openings 3 and cover the side surfaces 31 exclusively in their transition areas to the substrate 1 (FIG. 1E).

Figure 1F:
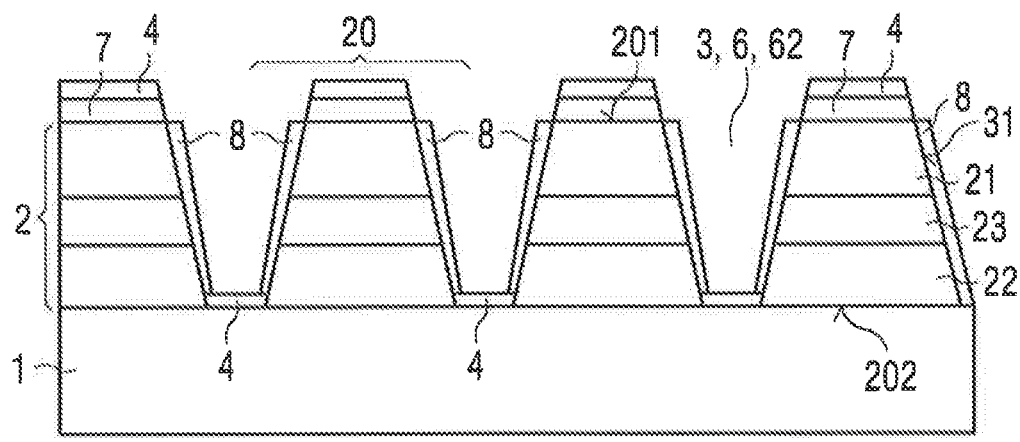

According to FIG. 1F, a passivation layer 8 is applied to the exposed side surfaces 31. The passivation layer 8 is preferably made of an electrically insulating material which differs from a material of the protective layer 4. The passivation layer 8 covers the oblique side surfaces 31 in particular completely.

It is conceivable that remnants of the protective layer 4 and the mask 7 are subsequently completely removed from the semiconductor body 2. Furthermore, it is possible that the substrate 1 is separated from the semiconductor body 2 in a subsequent process step and the remnants of the protective layer 4 are removed from the side surfaces 31, in particular in the transition regions between the substrate 1 and the semiconductor body 2. By detaching the substrate 1, the semiconductor body 2 can be separated along the separating trenches 6 to form a plurality of main bodies 20, whose side surfaces 31 are already covered by the passivation layer 8. The main body 20 can be arranged on a separately manufactured carrier 9 and together with the carrier 9 forms a component 10 (FIG. 6), for example, a light-emitting diode. Alternatively, it is possible to singulate, in particular saw through the substrate 1 along the separating trenches 6 into a plurality of carriers, wherein a main body 20 is arranged on each of the carriers 9.

Figure 2A:
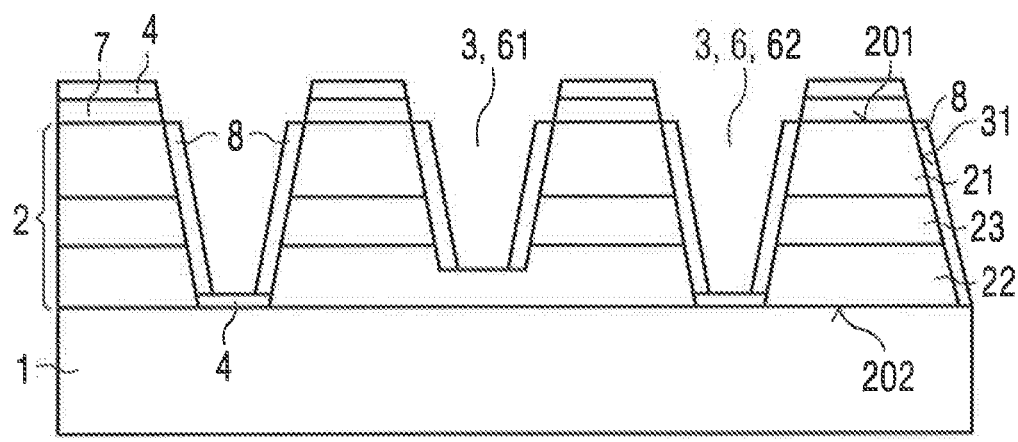

The exemplary embodiment for a method step shown in FIG. 2A essentially corresponds to the exemplary embodiment shown in FIG. 1F. In contrast, at least one opening 3 is formed as a recess 61 extending from the first main surface 201 throughout the first semiconductor layer 21 and the active layer 23 into the second semiconductor layer 22. The recess 61 thus has a bottom surface, in particular a flat bottom surface, which is arranged in the vertical direction between the first main surface 201 and the second main surface 202. The semiconductor body 2 may have a plurality of such recesses 61, which in particular are laterally spaced from one another.

Figure 2B:
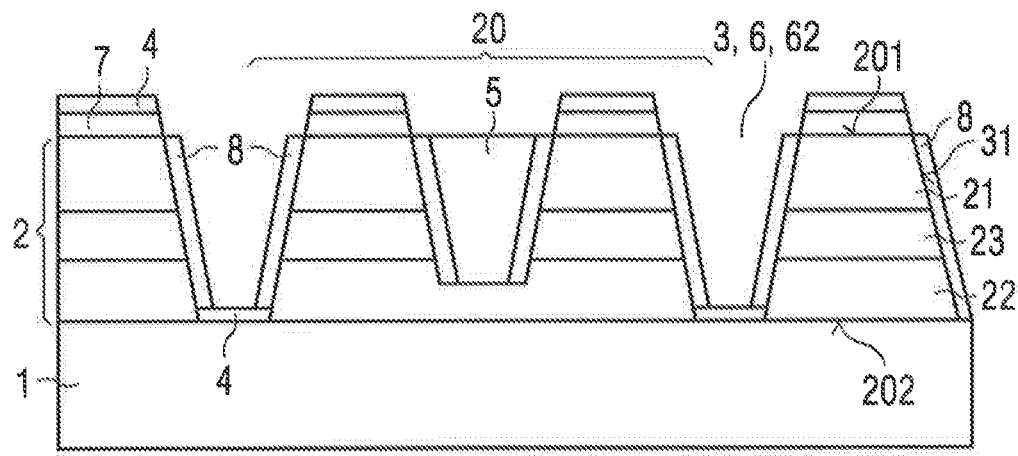

According to FIG. 2B, the recess 61 or the plurality of recesses 61 can be filled with an electrically conductive material to form one or several through-vias 5. In this case, the main body 20 may have at least one through-via 5, wherein the first semiconductor layer 21 and the second semiconductor layer 22 of the main body 20 can both be electrically connected via the first main surface 201. A component 10, for instance as shown in FIG. 6, can have such a main body 20 on a carrier 9, wherein the first main surface 201 faces the carrier 9 and the component 10 can be electrically connected externally, in particular via the first main surface 201 and the carrier 9. The second main surface 202 is free of a growth substrate, e.g., free of the substrate 1, and can serve as the radiation entry or exit surface of the component 10.

Figure 3A:
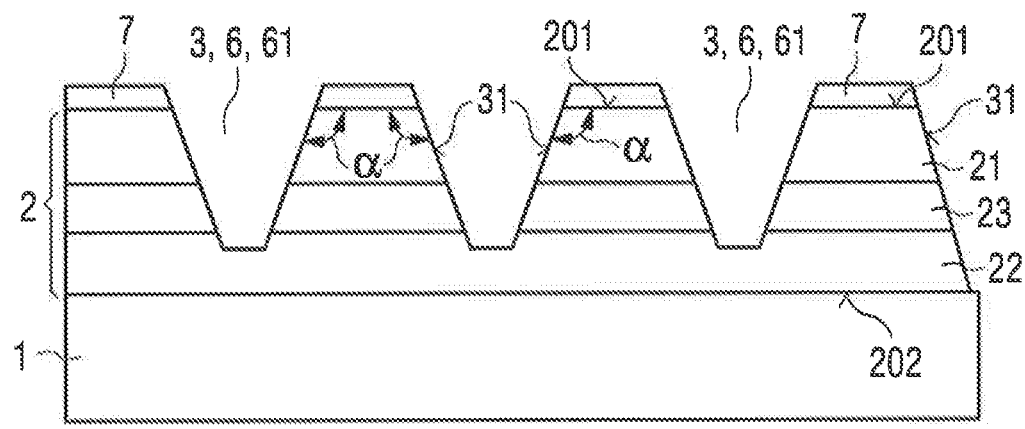

The exemplary embodiment for a method step shown in FIG. 3A essentially corresponds to the exemplary embodiment shown in FIG. 1C. In contrast to this, all openings 3 are initially formed as recesses 61 which extend from the first main surface 201 throughout the first semiconductor layer 21 and the active layer 23 into the second semiconductor layer 22. Deviating from this, it is possible that the recesses 61 only extend from the first main surface 201 into the first semiconductor layer 21 or into the active layer 23. The openings 3 can be formed as elongated separating trenches 6 or as isolated openings 3 laterally spaced from each other.

Figure 3B:
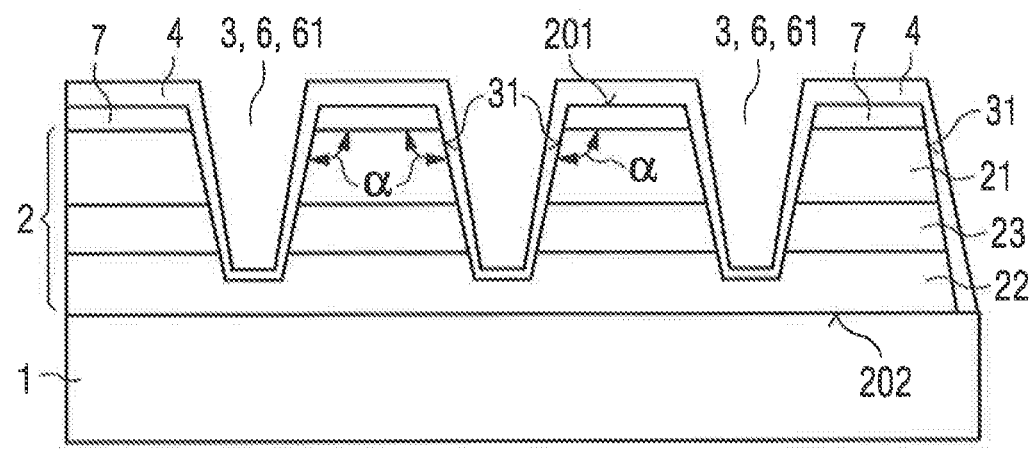

The exemplary embodiment for a method step shown in FIG. 3B essentially corresponds to the exemplary embodiment shown in FIG. 1D but with the difference that the openings 3 are initially formed as recesses 61, whose side surfaces 31 are covered by the protective layer 4. The protective layer 4 is removed from the side surfaces 31 in a subsequent method step, whereupon at least some or all of the recesses 61 can be formed into through-recesses 62. In particular, the through-recesses 62 serve as separating trenches between the adjacent main bodies 20 of the semiconductor body 2. In contrast to FIGS. 1D and 1E, the surfaces of the substrate 1 exposed in FIG. 3B are free of the protective layer 4 and/or of the remnants of the protective layer 4.

The recesses 61, which are not formed into through-recesses 62, can be filled with an electrically conductive material to form the through-vias 5 (FIG. 3D). The exemplary embodiment for a method step shown in FIG. 3D essentially corresponds to the exemplary embodiment shown in FIG. 2B, but without the remnants of the protective layer 4 on the exposed surfaces of the substrate 1.

Figure 4A:
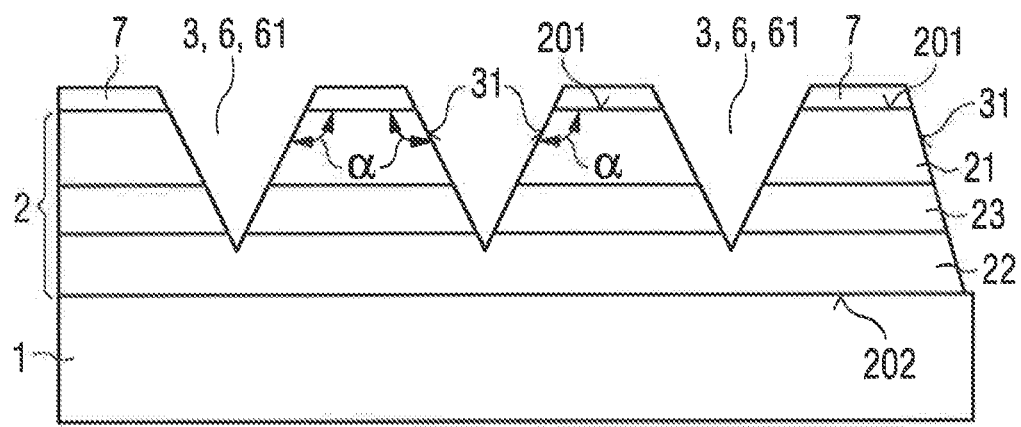
Figure 4B:
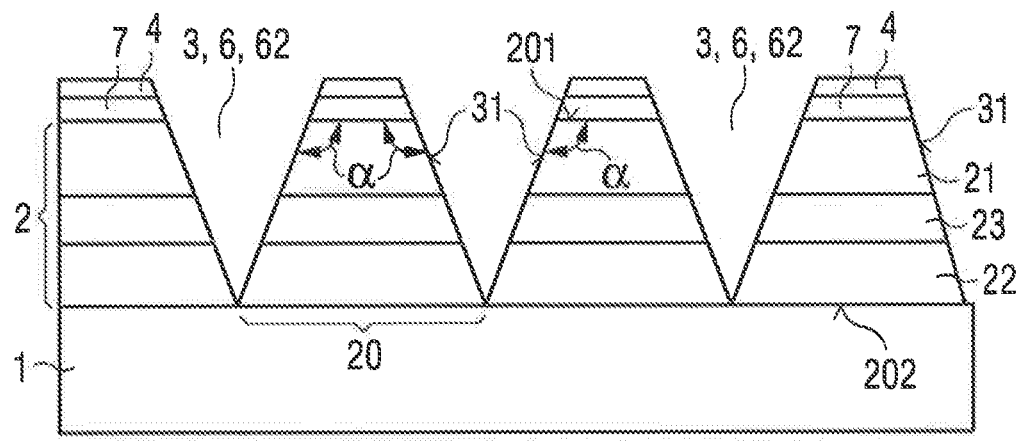

The exemplary embodiment for a method step shown in FIG. 4A essentially corresponds to the exemplary embodiment shown in FIG. 3A. In contrast, the recesses 61 each have a tapered shape, such as the shape of a cone, a pyramid or an elongated prism having a triangle as the base. After the semiconductor body 2 is completely covered with a protective layer 4 and the side surfaces 31 are subsequently freed from the protective layer 4, the recesses 61, in particular at the exposed side surfaces 31, can be formed into through-recesses 62 throughout the semiconductor body 2 (FIG. 4B).

Figure 5A:
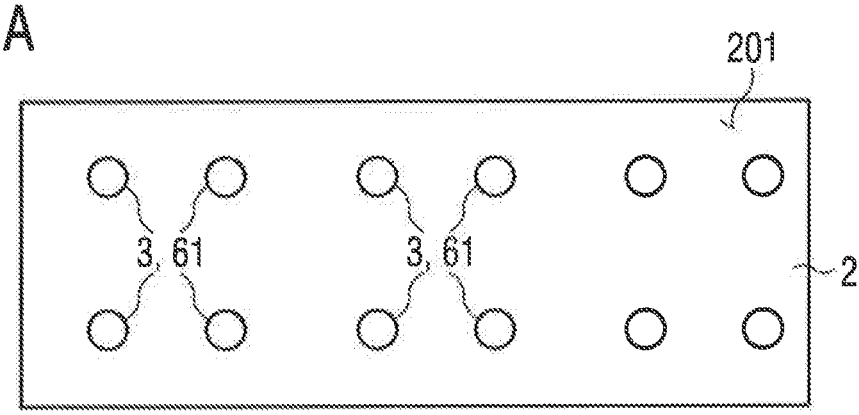
FIGS. 5A, 5B and 5C show schematic representations of a semiconductor body each in a top view.
Figure 5B:
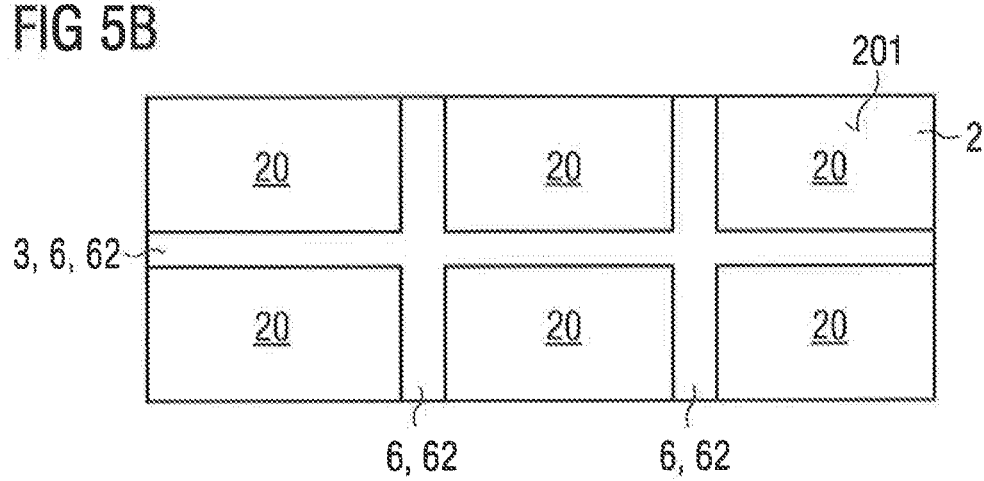
Figure 5C:
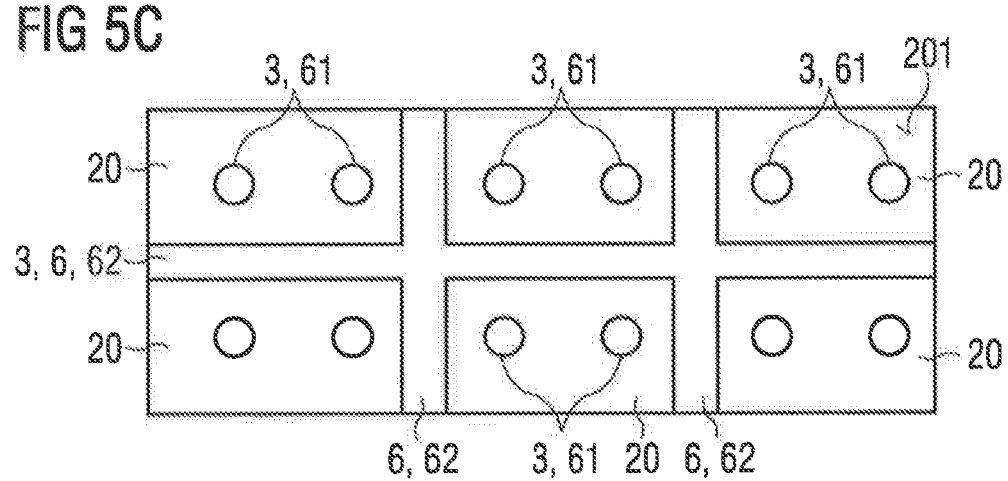

FIGS. 5A, 5B and 5C show schematically that the openings 3 can be formed as laterally spaced recesses 61 (FIG. 5A) or as separating trenches 6, for example, in the form of elongated through-recesses 62 (FIG. 5B). FIG. 5C describes a combination of FIGS. 5A and 5B, wherein the openings 3 are formed partly as laterally spaced recesses 61 and partly as separating trenches 6 and/or as elongated through-recesses 62. The separating trenches 6 and 62 divide the semiconductor body 2 into a plurality of main bodies 20 each having one or a plurality of recesses 61, wherein the recesses 61 can be filled with an electrically conductive material to form the through-vias 5.

FIG. 7 shows a section of the semiconductor body 2 having an oblique side surface 31'. Due to the production conditions, the side surface 31' may have depressions or elevations and is therefore generally not absolutely flat or mathematically flat. In such cases, the angles between the side surface 31' and the first main surface 201 or the second main surface 202 can be determined using a side surface 31 which is approximated as being flat. For example, the side surface 31, which is approximated as being flat, can be determined using the least squares method. The angles α and β are then angles between the side surface 31 approximated as being flat and the first main surface 201 and the second main surface 202, respectively.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A method for exposing side surfaces of a semiconductor body, the method comprising:
providing the semiconductor body having a laterally extending first main surface;
forming a plurality of vertical side surfaces by partially removing material of the semiconductor body thereby removing the first main surface in places, wherein each of the side surfaces forms an angle (α) between 110° and 160° inclusive with a remaining first main surface;
applying a protective layer onto the semiconductor body so that, in a plan view, the protective layer completely covers the remaining first main surface and the obliquely formed side surfaces; and
partially removing the protective layer so that the protective layer is removed in regions on the obliquely formed side surfaces because of an inclination and remains at least partially preserved in regions on the remaining first main surface during a common process operation,
wherein the protective layer is removed locally in a self-adjusted manner by a common etching operation,
wherein the protective layer is removed solely due to a higher etching rate on the obliquely formed side surfaces, and
wherein the protective layer is only thinned due to a lower etching rate on the remaining first main surface.

2. The method according to claim 1, wherein the common etching operation comprises dry etching.

3. The method according to claim 1, wherein the protective layer is formed from at least one material from the group consisting of $Al_2O_3$, $SiO_2$, $Ta_2O_5$, AlN, $TiO_2$, $ZrO_2$, $HfO_2$ and SiN.

4. The method according to claim 1, wherein the protective layer is formed from $Al_2O_3$, and wherein the protective layer is removed on the side surfaces by an Ar-assisted dry etching process.

5. The method according to claim 1, wherein removing the protective layer comprises exposing the side surfaces, and wherein, after removing the protective layer, the method further comprises applying an electrically insulating material onto the exposed side surfaces so that the side surfaces are covered by a passivation layer made of the insulating material.

6. The method according to claim 1, wherein the protective layer is applied onto the semiconductor body by atomic layer deposition, vapor deposition, sputtering, chemical vapor deposition or by plasma-enhanced chemical vapor deposition.

7. The method according to claim 1, wherein forming the plurality of vertical side surfaces comprises forming a mask comprising windows, wherein the obliquely formed side surfaces are produced at least partially in regions of the windows, and wherein the mask is covered by the protective layer after applying the protective layer.

8. The method according to claim 1, wherein the side surfaces are inner walls of laterally spaced openings which are completely enclosed by the semiconductor body in lateral directions.

9. The method according to claim 1, wherein the side surfaces are side flanks of openings of the semiconductor body which are formed as trenches and extend along an entire lateral extent of the semiconductor body.

10. The method according to claim 1, wherein the side surfaces extend along a vertical direction from the first main surface to a bottom surface which is flat and parallel to the first main surface.

11. The method according to claim 10, wherein the semiconductor body has a second main surface facing away from the first main surface and the bottom surface is arranged in the vertical direction between the first main surface and the second main surface.

12. The method according to claim 10, wherein the semiconductor body has a second main surface facing away from the first main surface, and wherein the bottom surface and the second main surface are at the same vertical height.

13. The method according to claim 1, wherein the obliquely formed side surfaces do not extend over an entire vertical extent of the semiconductor body and thereby form inner walls of recesses of the semiconductor body.

14. The method according to claim 13, wherein the side surfaces are exposed while partially removing the protective layer, and wherein the recesses are formed after partially removing the protective layer to form through-recesses throughout the semiconductor body.

15. The method according to claim 1, wherein the obliquely formed side surfaces do not extend over an entire vertical extent of the semiconductor body and thereby form inner walls of recesses of the semiconductor body, wherein the side surface are exposed from the protective layer, wherein the side surfaces are exposed while at least partially removing the protective layer, and wherein at least some of the recesses are formed throughout the semiconductor body after partially removing the protective layer to form through-recesses.

16. The method according to claim 1,
wherein the side surfaces are inner walls of laterally spaced openings which are completely enclosed by the semiconductor body in lateral directions,
wherein the semiconductor body has a second main surface facing away from the first main surface,
wherein the side surfaces extend along a vertical direction from the first main surface to a bottom surface, and
wherein, in the vertical direction, the bottom surface is located between the first main surface and the second main surface.

17. A method for exposing side surfaces of a semiconductor body, the method comprising:
providing the semiconductor body having a laterally extending first main surface;
forming a plurality of vertical side surfaces by partially removing material of the semiconductor body thereby removing the first main surface in places, wherein each of the side surfaces forms an angle between 110° and 160° inclusive with a remaining first main surface;
applying a protective layer onto the semiconductor body so that, in a plan view, the protective layer completely covers the remaining first main surface and the obliquely formed side surfaces; and
partially removing the protective layer so that the protective layer is removed in regions on the obliquely formed side surfaces because of an inclination and remains at least partially preserved in regions on the remaining first main surface during a common process operation,
wherein removing the protective layer comprises exposing the side surfaces, and
wherein, after removing the protective layer, the method further comprises applying an electrically insulating material onto the exposed side surfaces so that the side surfaces are covered by a passivation layer made of the insulating material; or
wherein forming the plurality of vertical side surfaces comprises forming a mask comprising windows, wherein the obliquely formed side surfaces are produced at least partially in regions of the windows, and wherein the mask is covered by the protective layer after applying the protective layer.

18. The method according to claim 17, wherein the protective layer is formed from at least one material from the group consisting of $Al_2O_3$, $SiO_2$, $Ta_2O_5$, AlN, $TiO_2$, $ZrO_2$, $HfO_2$ and SiN.

19. A method for exposing side surfaces of a semiconductor body, the method comprising:
providing the semiconductor body having a laterally extending first main surface;
forming a plurality of vertical side surfaces by partially removing material of the semiconductor body and thereby removing the first main surface in places, wherein each of the side surfaces forms an angle between 110° and 160° inclusive with a remaining first main surface;
applying a protective layer onto the semiconductor body so that, in a plan view, the protective layer completely covers the remaining first main surface and the obliquely formed side surfaces; and
partially removing the protective layer so that the protective layer is removed in regions on the obliquely formed side surfaces because of an inclination and remains at least partially preserved in regions on the remaining first main surface during a common process operation,
wherein the side surfaces extend along a vertical direction from the first main surface to a bottom surface which is flat and parallel to the first main surface,
wherein the semiconductor body has a second main surface facing away from the first main surface, and
wherein the bottom surface and the second main surface are at same vertical height.

20. The method according to claim 19, wherein the protective layer is formed from at least one material from the group consisting of $Al_2O_3$, $SiO_2$, $Ta_2O_5$, AlN, $TiO_2$, $ZrO_2$, $HfO_2$ and SiN.

* * * * *